United States Patent
Yu et al.

(10) Patent No.: US 10,163,804 B2
(45) Date of Patent: Dec. 25, 2018

(54) MOLDING STRUCTURE FOR WAFER LEVEL PACKAGE

(71) Applicant: Taiwan Semiconductor Manufacturing Company, Ltd., Hsinchu (TW)

(72) Inventors: Chen-Hua Yu, Hsinchu (TW); Chung-Shi Liu, Hsinchu (TW); Chih-Fan Huang, Kaohsiung (TW); Hui-Min Huang, Taoyuan (TW); Wei-Hung Lin, Xinfeng Township (TW); Ming-Da Cheng, Jhubei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 15/887,815

(22) Filed: Feb. 2, 2018

(65) Prior Publication Data

US 2018/0158780 A1    Jun. 7, 2018

Related U.S. Application Data

(63) Continuation of application No. 14/225,218, filed on Mar. 25, 2014, now Pat. No. 9,887,162.

(Continued)

(51) Int. Cl.
*H01L 23/538* (2006.01)
*H01L 23/31* (2006.01)
(Continued)

(52) U.S. Cl.
CPC ........ *H01L 23/5389* (2013.01); *H01L 21/565* (2013.01); *H01L 23/3128* (2013.01); *H01L 24/19* (2013.01); *H01L 25/105* (2013.01); *H01L 21/566* (2013.01); *H01L 23/295* (2013.01); *H01L 24/73* (2013.01); *H01L 2224/12105* (2013.01); *H01L 2224/32225* (2013.01); *H01L 2224/32245* (2013.01); *H01L 2224/48095* (2013.01); *H01L 2224/48227* (2013.01);

(Continued)

(58) Field of Classification Search
CPC ....... H01L 2924/00; H01L 2924/00014; H01L 2224/32225; H01L 2224/48227; H01L 2224/73265; H01L 2924/181; H01L 2924/00012
See application file for complete search history.

(56) References Cited

U.S. PATENT DOCUMENTS 7,633,157 B2 * 12/2009 Jiang .................. H01L 23/16
                                                                257/724
2004/0201074 A1    10/2004 Khandros et al.
(Continued)

*Primary Examiner* — Tony Tran
(74) *Attorney, Agent, or Firm* — Slater Matsil, LLP

(57) ABSTRACT

A method in which microelectronic devices are attached to a substrate surface, wherein spaces interpose neighboring ones of the microelectronic devices. Each microelectronic device has an outermost surface that is substantially parallel to the substrate surface. The substrate is closed in a transfer molding cavity of a transfer molding apparatus such that an internal surface of the transfer molding cavity contacts a substantial portion of each of the outermost surfaces of the microelectronic devices. A molding compound is subsequently injected into the transfer molding cavity, including into the spaces between ones of the plurality of microelectronic devices.

20 Claims, 2 Drawing Sheets

Related U.S. Application Data

(60) Provisional application No. 61/917,837, filed on Dec. 18, 2013.

(51) Int. Cl.
  *H01L 21/56* (2006.01)
  *H01L 23/00* (2006.01)
  *H01L 25/10* (2006.01)
  *H01L 23/29* (2006.01)

(52) U.S. Cl.
  CPC ............ *H01L 2224/48465* (2013.01); *H01L 2224/73265* (2013.01); *H01L 2224/73267* (2013.01); *H01L 2225/1035* (2013.01); *H01L 2225/1058* (2013.01); *H01L 2924/15311* (2013.01); *H01L 2924/18162* (2013.01)

(56) References Cited

U.S. PATENT DOCUMENTS

| | | |
|---|---|---|
| 2004/0238909 A1 | 12/2004 | Boon et al. |
| 2006/0261498 A1 | 11/2006 | James |
| 2007/0148820 A1 | 6/2007 | Thurgood |
| 2008/0206930 A1* | 8/2008 | Farnworth .............. H01L 21/56 438/127 |
| 2014/0293529 A1* | 10/2014 | Nair ..................... H01Q 1/2291 361/679.31 |

\* cited by examiner

MOLDING STRUCTURE FOR WAFER LEVEL PACKAGE

PRIORITY CLAIM AND CROSS-REFERENCE

This application is a continuation of U.S. application Ser. No. 14/225,218, filed on Mar. 25, 2014, which claims the benefit of U.S. Provisional Application No. 61/917,837, entitled "Molding Structure for Wafer Level Package," filed Dec. 18, 2013, the entireties of both are hereby incorporated herein by reference.

BACKGROUND

In semiconductor manufacturing, package on package (PoP) stacking and redistribution layer (RDL) processes utilize the formation of a molding compound and subsequent and chemical-mechanical planarizing (CMP), grinding, polishing, and other mechanical material removal processes to expose the die of integrated circuit devices. However, the mechanical material removal processes can present issues for device function, and can drive up the costs associated with package assembly. For example, mechanical material removal processes can cause scratches that harm input/output (I/O) surfaces of the devices, and may further generate particles that cause PoP joints and connections to fail, or that cause RDL openings. Consequently, only about 80% of die area may be adequately exposed after the molding and mechanical material removal processes are performed. Moreover, existing molding methods too often fail to adequately prevent die shifting during assembly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
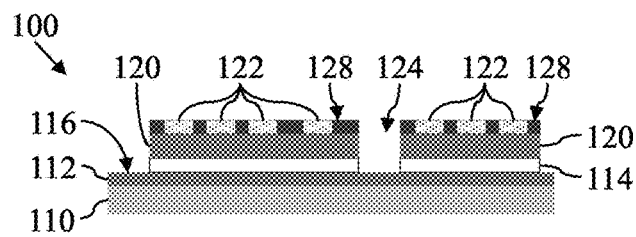
FIG. 1 is a sectional view of a portion of an apparatus in an intermediate stage of manufacture in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a sectional view of a portion of an apparatus 100 in an intermediate stage of manufacture according to one or more aspects of the present disclosure. The apparatus 100 comprises multiple microelectronic devices 120 coupled to a substrate 110. The microelectronic devices 120 may comprise one or more integrated circuit (IC) chips, dies, and/or other IC devices, each of which may comprise at least portions of one or more active and/or passive devices and/or components (not shown), such as transistors, capacitors, resistors, inductors, logic circuits, memory circuits, and/or other microelectronic components, assemblies, and/or packages that may be utilized to generate desired structural and functional requirements. The microelectronic devices 120 may be formed by any suitable methods, whether conventional or future-developed. Each microelectronic device 120 may include one or more contact pads 122, such as may be utilized by one or more redistribution layers, interconnect structures, and/or other means for connecting components, circuits, and/or other features of the microelectronic devices 120 within a larger package assembly. Spaces 124 interpose neighboring ones of the microelectronics devices 120 along the substrate 110. An outermost surface 128 of each microelectronic device 120 is substantially parallel to the surface 116 of the substrate 110 (or a layer thereon) to which the microelectronic devices 120 are coupled.

The substrate 110 may include considerably more features and/or characteristics than as schematically depicted in FIG. 1. For example, the substrate 110 may be or comprise a coreless substrate, such as may comprise one or more metal layers formed on one or both sides of an insulation layer. The substrate 110 may also be or comprise a single-sided or double-sided copper clad laminate (CCL), a prepreg or ajinomoto build-up film (ABF), paper, glass fiber, non-woven glass fabric, one or more layers of copper, nickel, aluminum, and/or other materials, elements, and/or compositions. The substrate 110 may also be or comprise a printed circuit board (PCB) and/or otherwise include multiple conductive traces formed on one or both sides, and may include vias, pillars, and/or other conductors extending through the substrate 110 between traces on opposite sides of the substrate 110.

The apparatus 100 may further comprise a coating layer 112 interposing the substrate 110 and the microelectronic devices 120. The outermost surface 128 of each microelectronic device 120 may be substantially parallel to the coating layer 112. The coating layer 112 may comprise one or more layers of glass, adhesive, and/or other materials deposited on the substrate 110. Each microelectronic device 120 may be coupled to the substrate 110 by an adhesive layer 114, whether directly or to the coating layer 112. The adhesive layer 114 may comprise one or more layers of glue, polymer adhesive, and/or other materials.

Figure 2:
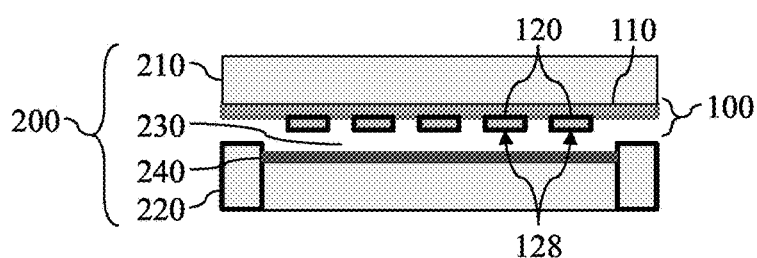
FIG. 2 is a sectional view of the apparatus shown in FIG. 1 in a subsequent stage of manufacture in accordance with some embodiments.

FIG. 2 is a simplified view of at least a larger portion of the apparatus 100 (relative to the smaller portion shown in FIG. 1) in a subsequent stage of manufacture according to one or more aspects of the present disclosure. In FIG. 2, the apparatus 100 has been flipped upside-down and subsequently installed in a transfer molding apparatus 200. The transfer molding apparatus 200 is depicted in FIG. 2 as including a top portion 210 and a bottom portion 220, although the transfer molding apparatus 200 includes additional components (e.g., see FIG. 3). When closed together, the top portion 210 and the bottom portion 220 collectively form a transfer molding cavity 230.

The bottom portion 220 includes a release layer 240 coating one or more internal surfaces that partially define the transfer molding cavity 230. The release layer 240 may comprise one or more layers of polytetrafluoroethylene (PTFE) and/or ethylene tetrafluoroethylene (ETFE), although other materials are also within the scope of the present disclosure.

The apparatus 100 may be installed in the transfer molding apparatus 200 by attaching the substrate 110 to an inside surface of the top portion 210. Such attachment may utilize a vacuum applied to the backside of the substrate 110, one or more clips and/or threaded fasteners, a temporary adhesive, and/or combinations thereof, although other attachment means are also within the scope of the present disclosure. Once installed in the transfer molding cavity 230, the outermost surfaces 128 of the microelectronic devices 120 opposite the substrate 110 are substantially parallel to the release layer 240.

Figure 3:
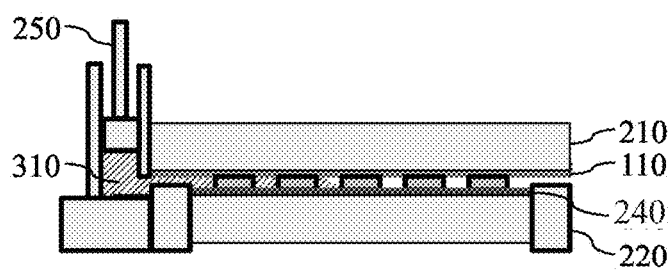
FIG. 3 is a sectional view of the apparatus shown in FIG. 2 in a subsequent stage of manufacture in accordance with some embodiments.

FIG. 3 is a sectional view of the transfer molding apparatus 200 after closing the top portion 210 and bottom portion 220 around the substrate 100, such that the release layer 240 contacts a substantial portion of the outermost surface 128 of each microelectronic device 120. FIG. 3 also depicts an injector 250 of the transfer molding apparatus 200 operable to inject a molding compound 310 into the transfer molding cavity 230. The injector 250 may be or comprise a plunger, a pump, a valve, and/or other means for injecting the molding compound 310 into the transfer molding cavity 230. For embodiments in which the injector 250 comprises a pump, the pump may be a positive displacement pump or other type of pump operable to push the molding compound 310 into the transfer molding cavity 230. The pump may alternatively be a vacuum pump or other type of pump operable to pull or suck the molding compound 310 into the transfer molding cavity 230. Thus, the injector 250 may be operable to reduce the pressure within the transfer molding cavity 230 to below an injection pressure at which the molding compound 310 is injected into the transfer molding cavity 230. For example, the reduced pressure within the transfer molding cavity 230 may be a substantial vacuum.

The molding compound 310 may comprise macromolecule epoxy with silica or aluminum oxide filler, among other possible materials. The molding compound 310 may have a matrix composition, in which a bulk material includes a plurality of micro-filler elements, as described below with reference to FIG. 9.

As the molding compound 310 fills the transfer molding cavity 230, the release layer 240 and/or another portion of the transfer molding cavity 230 remains in abutment against the outermost surfaces 128 of the microelectronic devices 120. As such, the molding compound 310 flows in the spaces 124 between the microelectronic devices 120, but is prevented from contacting the outermost surfaces 128 of the microelectronic devices 120. Consequently, the molding compound 310 will not require subsequent removal from the outermost surfaces 120 of the microelectronic devices 120, as would otherwise require chemical-mechanical planarizing (CMP), grinding, polishing, and/or other mechanical material removal processes.

In FIGS. 2 and 3, the release layer 240 is a substantially continuous film covering all or a portion of the inner surface of the bottom portion 220 that is adjacent the outermost surfaces 128 of the microelectronic devices 120. However, the release layer 240 may instead be patterned, perhaps in a manner permitting the molding compound 310 to contact desired portions of the outermost surfaces 128 of the microelectronic devices 120, but not portions of the outermost surfaces 128 of the microelectronic devices 120 where it is not desired, such as the contact pads 122 shown in FIG. 1.

Injecting the molding compound 310 may include heating the molding compound 310 to a temperature ranging between about 100° C. and about 200° C., whether before, during, and/or after injection. For example, such heating may entail operating a heating element (not shown) within the top portion 210 of the transfer molding apparatus 200, the bottom portion 220 of the transfer molding apparatus 200, or both. The injection may be at a pressure ranging between about 3 MPa and about 10 MPa. Elevated temperature and/or pressure utilized in conventional molding processes often caused microelectronic devices to shift position along their substrate, perhaps becoming dislodged from their initial position by up to ten microns. However, positioning the microelectronic devices 120 in abutment against the release layer 240 according to one or more aspects of the present disclosure reduces or eliminates such shifting. In some embodiments, the shifting may be reduced to less than about five microns, if not eliminated all together.

Moreover, conventional compression molding processes included loading the molding compound in the mold before closing the mold. However, the transfer molding process employed in embodiments within the scope of the present disclosure includes injecting the molding compound 310 into the transfer molding cavity 230 after the top portion 210 and bottom portion 220 of the transfer molding apparatus 200 are closed together around the apparatus 100. Consequently, the molding compound 310 is less likely to dislodge the microelectronic devices 120 from their initial positions on the substrate 110.

Figure 4:
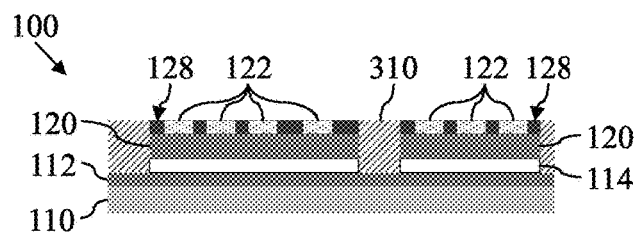
FIG. 4 is a sectional view of the apparatus shown in FIG. 3 in a subsequent stage of manufacture in accordance with some embodiments.

Similarly, conventional compression molding can result in only about 80% of the outermost surfaces of the microelectronic devices remaining exposed. However, utilizing transfer molding according to one or more aspects of the present disclosure may result in as much as 99% of the outermost surfaces 128 of the microelectronic devices 120 remaining exposed. For example, FIG. 4 is a sectional view of the apparatus 100 after being removed from the transfer molding apparatus 200 and subsequently flipped again to an upright orientation. As shown therein, substantially all of the outermost surfaces 128 of the microelectronic devices 120 remain free of the molding compound 310.

Figure 5:
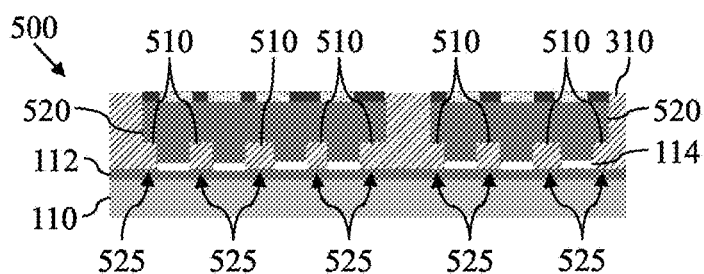
FIG. 5 is a sectional view of another embodiment of the apparatus shown in FIG. 4 in accordance with some embodiments.

FIG. 5 is a sectional view of another embodiment of the apparatus 100 shown in FIG. 4, herein designated by the reference number 500. The apparatus 500 shown in FIG. 5 may be substantially similar to the apparatus 100 shown in FIG. 1, except that the apparatus 500 includes molded underfill (MUF) structures 510. That is, the apparatus 500 includes microelectronic devices 520 that are substantially similar to the microelectronic devices 120 shown in FIGS. 1-4 except that the microelectronic devices 520 include spaces 525 between the dies and the substrate 110. The spaces 525 may be defined between protrusions extending from the microelectronic devices 520, protrusions extending from the substrate 110, or discrete members (e.g., of a ball-grid array) extending between the microelectronic devices 520 and the substrate 110. When the molding compound 310 is injected as described above, it may also fill the spaces 525 between the dies of the microelectronic devices 520 and the substrate 110, thus forming the MUF structures 510.

Figure 6:
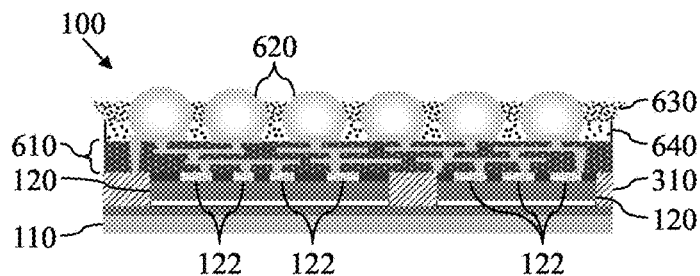
FIG. 6 is a sectional view of the apparatus shown in FIG. 4 in a subsequent stage of manufacture in accordance with some embodiments.

FIG. 6 is a sectional view of the apparatus 100 shown in FIG. 4 in a subsequent stage of manufacture according to one or more aspects of the present disclosure, although analogous embodiments may instead utilize the implementation shown in FIG. 5 and still remain within the scope of the present disclosure. In FIG. 6, redistribution layers 610 have been formed over portions of the microelectronic devices 120. The example embodiment depicted in FIG. 6 includes three redistribution layers 610, although other embodiments within the scope of the present disclosure may include fewer or more than three redistribution layers 610. The redistribution layers 610 may comprise copper, aluminum, doped polysilicon, and/or other materials, and may be formed via chemical-vapor deposition (CVD), damascene, and/or other processes. The thickness of the redistribution layers 610 may range between about one micron about twenty microns, although other thicknesses are also within the scope of the present disclosure.

A first or lowest one of the redistribution layers 610 contacts at least some of the contact pads 122 of the microelectronic devices 120. The apparatus 100 may also include a ball-grid array 620 having elements connected to topmost portions of the redistribution layers 610. A second layer of molding compound 630 may be formed above the redistribution layers 610 and in the spaces between the elements of the ball-grid array 620. The second molding compound 630 may be substantially similar in composition and/or formation relative to the molding compound 310.

The apparatus 100 may also comprise a liquid molding compound 640 between the redistribution layers 610 and in the spaces between the elements of the ball-grid array 620. In such embodiments, the apparatus 100 may still include the second molding compound 630, such that the liquid molding compound 640 is disposed between the redistribution layers 610 and the second molding compound 630. However, instead of the liquid molding compound 640, or in addition thereto, the apparatus 100 may comprise a local mechanical stress control feature, such as may comprise a silicon nitride layer, perhaps with a germanium-ion implantation to selectively relax stress, although other materials are also within the scope of the present disclosure.

Figure 7:
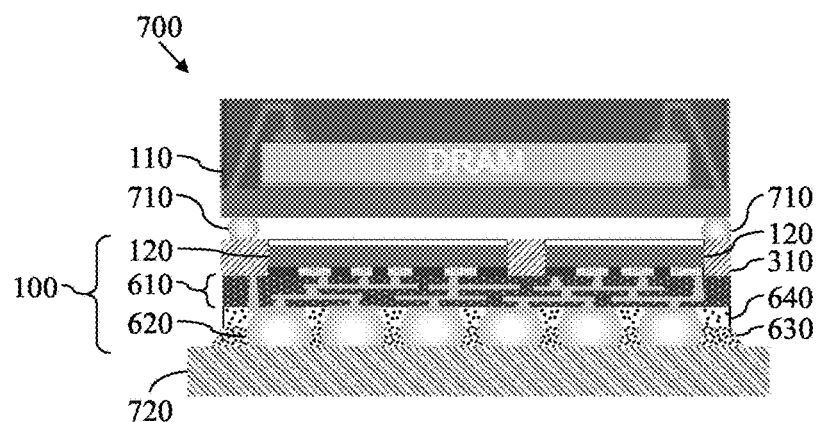
FIG. 7 is a sectional view of the apparatus shown in FIG. 6 in a subsequent stage of manufacture in accordance with some embodiments.

FIG. 7 is a sectional view of at least a portion of the apparatus 100 shown in FIG. 6 incorporated in a package-on-package (PoP) type apparatus 700 according to one or more aspects of the present disclosure. In FIG. 7, the apparatus 100 shown in FIG. 6 is oriented upside down, such that the ball-grid array 620 appears near the bottom of the apparatus 100 instead of the top. Also, in the embodiment depicted in FIG. 7, the substrate 110 is or includes (or alternatively may be replaced by) a dynamic random-access memory (DRAM) device, and is coupled to the remainder of the apparatus 700 via one or more solder balls 710 and/or other mechanical and/or electrical means. The apparatus 700 is also depicted as comprising an additional substrate 720, which may be or comprise a PCB and/or other substrate typical of PoP apparatus.

Figure 8:
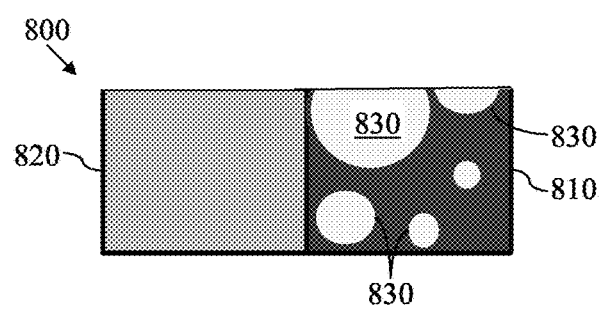
FIG. 8 is a schematic view of a portion of prior art apparatus.

FIG. 8 is a schematic view of a portion of a prior art apparatus 800 comprising a molding compound 810 adjacent to a microelectronics device 820. The molding compound 810 comprises micro-filler elements 830 that have been damaged by CMP, grinding, polishing, and/or other mechanical material removal processes, such that boundaries of some of the micro-filler elements 830 are substantially planar and parallel to one or more surfaces of the molding compound 810 and/or the microelectronics device 820. Such parallelism and/or the resulting uneven profile of the molding compound 810 may present delamination and/or other problems for device assembly and/or function.

Figure 9:
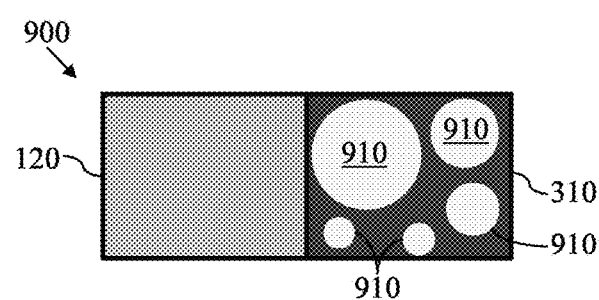
FIG. 9 is a schematic view of a portion of the apparatus shown in one or more of FIGS. 4-7 in accordance with some embodiments.

FIG. 9 is a schematic view of a corresponding portion of the apparatus 100 shown in FIG. 6 or 7 according to one or more aspects of the present disclosure. As with the prior art apparatus 800 depicted in FIG. 8, the molding compound 310 of the present disclosure may include micro-filler elements 910. The micro-filler elements 910 may comprise glass spheres, although other materials and geometric shapes are also within the scope of the present disclosure. However, whereas the micro-filler elements 830 shown in FIG. 8 have been damaged, the micro-filler elements 910 shown in FIG. 9 are intact.

That is, for embodiments in which the molding compound 310 comprises micro-filler elements 910, the micro-filler elements 910 may remain substantially whole and intact, having not been compromised by any mechanical material removal processes. As such, the micro-filler elements 910 may be maintained as substantially regularly-shaped, geometric, three-dimensional elements, and may not include any boundaries that are substantially parallel to any surfaces of the molding compound 310 and/or microelectronics devices 120. At most, the boundaries of the micro-filler elements 910 disposed at any boundary of the molding compound 310 may be tangent to a surface of the molding compound 310 and/or the microelectronics devices 120, but they will not be substantially parallel to any surface of the molding compound 310 and/or the microelectronics devices 110.

These and other embodiments within the scope of the present disclosure may exclude the utilization of mechanical material removal processes between injecting the molding compound 310 into the molding apparatus 200 and forming the redistribution layers 310, such as might otherwise be utilized to remove molding compound 310 from the contact pads 122 and/or other outermost surfaces 128 of the microelectronic devices 120. Accordingly, issues such as underexposing device elements when grinding or polishing too little, overgrinding and damaging devices, and contamination by particulate matter from these processes, may be reduced or eliminated by implementing one or more aspects of the present disclosure.

In view of all of the above, as well as the example implementations depicted in FIGS. 1-7, 9, and 10, a person having ordinary skill in the art will readily recognize that the present disclosure introduces one or more methods comprising attaching a plurality of microelectronic devices to a surface of a substrate, wherein spaces interpose neighboring ones of the plurality of microelectronic devices, and wherein each of the plurality of microelectronic devices has an outermost surface that is substantially parallel to the substrate surface. The substrate is subsequently closed in a transfer molding cavity of a transfer molding apparatus such that an internal surface of the transfer molding cavity contacts a substantial portion of each of the outermost surfaces of the plurality of microelectronic devices. A molding compound is subsequently injected into the transfer molding cavity, including into the spaces between ones of the plurality of microelectronic devices.

Closing the substrate in the transfer molding cavity may comprise abutting each of the outermost surfaces of the plurality of microelectronic devices against a release layer substantially coating an internal surface of the transfer molding cavity.

In at least one embodiment, the spaces are first spaces, and attaching the plurality of microelectronic devices to the substrate surface establishes second spaces between the substrate surface and at least one of the plurality of microelectronic devices. In such embodiments, injecting the molding compound substantially fills the first spaces and the second spaces.

The method may further comprise heating the molding compound. For example, the molding compound may be heated before and/or after being injected into the transfer molding cavity.

Injecting the molding compound may utilize a first pressure, and the method may further comprise establishing a second pressure within the transfer molding cavity, wherein the second pressure is substantially less than the first pressure. Establishing the second pressure may comprise establishing a substantial vacuum.

The method may further comprise removing the substrate from the transfer molding apparatus and subsequently forming at least one redistribution layer over ones of the plurality of microelectronic devices, wherein the at least one redistribution layer electrically interconnects at least two of the plurality of microelectronic devices. Mechanical material removal processes may be excluded from between the injection of the molding compound and the formation of the at least one redistribution layer. In at least one embodiment, the molding compound may be a first molding compound, the at least one redistribution layer may comprise a plurality of redistribution layers, and the method may further comprise depositing a ball-grid array on a topmost one of the plurality of redistribution layers, wherein the ball-grid array comprises a plurality of discrete conductive elements. In such embodiments, the method may further comprise forming a second molding compound around spaces between ones of the plurality of discrete conductive elements of the ball-grid array.

The substrate surface may be a surface of a coating layer formed on the substrate.

Attaching the plurality of microelectronic devices to the substrate surface may utilize an adhesive layer formed on each of the plurality of microelectronic devices.

The present disclosure also introduces one or more apparatus comprising a substrate, a plurality of microelectronic devices coupled to the substrate, and a molding compound disposed between each of the plurality of microelectronic devices. The molding compound comprises a plurality of micro-filler elements, and no boundary of any of the micro-filler elements is substantially parallel to a substantially planar surface of the molding compound or a substantially planar surface of any of the plurality of microelectronic devices.

At least one side of each of the plurality of microelectronic devices may be substantially parallel with a surface of the molding compound.

The apparatus may further comprise a ball-grid array, at least one redistribution layer, and a printed circuit board. The printed circuit board may be coupled to ones of the plurality of microelectronic devices via corresponding elements of the ball-grid array and the at least one redistribution layer. In such embodiments, the apparatus may further comprise a memory package, wherein each of the plurality of microelectronic devices is disposed between the printed circuit board and the memory package. The memory package may comprise dynamic random-access memory.

Each of the plurality of micro-filler elements may be a substantially regularly-shaped, geometric, three-dimensional element.

The present disclosure also introduces one or more methods comprising attaching a plurality of microelectronic devices to a surface of a substrate, wherein each of the plurality of microelectronic devices has an outermost surface that is substantially parallel to the substrate surface. The substrate is subsequently closed in a transfer molding cavity of a transfer molding apparatus such that an internal surface of the transfer molding cavity contacts a substantial portion of each of the outermost surfaces of the plurality of microelectronic devices. A molding compound is subsequently injected into the transfer molding cavity, including into the spaces between ones of the plurality of microelectronic devices, wherein the molding compound comprises a plurality of micro-filler elements, and wherein no boundary of any of the micro-filler elements is substantially parallel to a substantially planar surface of the molding compound or a substantially planar surface of any of the plurality of microelectronic devices.

Closing the substrate in the transfer molding cavity may comprise abutting each of the outermost surfaces of the plurality of microelectronic devices against a release layer substantially coating an internal surface of the transfer molding cavity.

In at least one embodiment, such methods may further comprise removing the substrate from the transfer molding apparatus and subsequently forming at least one redistribution layer over ones of the plurality of microelectronic devices, wherein the at least one redistribution layer electrically interconnects at least two of the plurality of microelectronic devices, and wherein mechanical material removal processes are excluded from between injecting the molding compound and forming the at least one redistribution layer.

In an embodiment, a method includes attaching a first surface of each of a plurality of microelectronic devices to a substrate, wherein, after the attaching, each of the plurality of microelectronic devices has a plurality of contact pads disposed at a second surface of each of the plurality of microelectronic devices, the second surface being opposite a respective first surface of each of the plurality of microelectronic devices attached to the substrate. The method further includes after attaching the first surface of each of the plurality of microelectronic devices to the substrate, closing the substrate in a transfer molding cavity of a transfer molding apparatus such that a release layer coating an internal surface of the transfer molding cavity physically contacts the plurality of contact pads exposed at the second surface of each of the plurality of microelectronic devices.

The method further includes injecting a molding compound into the transfer molding cavity around each of the plurality of microelectronic devices, wherein the release layer, in physically contacting the plurality of contact pads exposed at the second surface of each of the plurality of microelectronic devices, prevents the molding compound from physically contacting the plurality of contact pads. The method further includes removing the substrate from the transfer molding apparatus by removing the release layer from the second surface of each of the plurality of microelectronic devices. The method further includes forming at least one redistribution layer over ones of the plurality of microelectronic devices, the at least one redistribution layer physically contacts the second surface of each of the plurality of microelectronic devices, wherein the at least one redistribution layer electrically interconnects at least two of the plurality of microelectronic devices.

In an embodiment, a method includes attaching an innermost surface of each of a plurality of microelectronic devices to a surface of a planar substrate using an adhesive layer, the innermost surface of each of the plurality of microelectronic devices is proximate the surface of the planar substrate, and an outermost surface of each of the plurality of microelectronic devices is distal the surface of the planar substrate, the outermost surface of each of the plurality of microelectronic devices including contact pads of respective ones of the plurality of microelectronic device. The method further includes after attaching the innermost surface of each of the plurality of microelectronic devices to the surface of the planar substrate, positioning the plurality of microelectronic devices in a transfer molding cavity of a transfer molding apparatus, wherein at least the contact pads of each of the plurality of microelectronic devices are physically contacted by an insulating release layer of the transfer molding apparatus within the transfer molding cavity. The method further includes injecting a molding compound into the transfer molding cavity, the molding compound flowing on the surface of the planar substrate and around the plurality of microelectronic devices while the insulating release layer physically contacts the contact pads of each of the plurality of microelectronic devices, wherein after injecting the molding compound, the contact pads are exposed through the molding compound without any subsequent processing on the molding compound.

In an embodiment, a method includes attaching a first surface of a first semiconductor die to a substrate, a second surface of the first semiconductor die being disposed farther from the substrate than the first surface, the first semiconductor die comprising a first plurality of contact pads exposed at the second surface and opposite the first surface. The method further includes attaching a second semiconductor die to the substrate, the second semiconductor die comprising a second plurality of contact pads. The method further includes enclosing the first semiconductor die and the second semiconductor die in an internal molding cavity of a molding apparatus while the first semiconductor die and the second semiconductor die are attached to the substrate, enclosing the first semiconductor die and the second semiconductor die comprising physically contacting the first plurality of contact pads to an insulating release layer coating a surface of the internal molding cavity. The method further includes dispensing a molding compound between the first semiconductor die and the second semiconductor die, the insulating release layer preventing the molding compound from contacting the first plurality of contact pads during dispensing the molding compound. The method further includes removing the first semiconductor die and the second semiconductor die from the molding apparatus by heating the insulating release layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   attaching a first surface of each of a plurality of microelectronic devices to a substrate, wherein, after the attaching, each of the plurality of microelectronic devices has a plurality of contact pads disposed at a second surface of each of the plurality of microelectronic devices, the second surface being opposite a respective first surface of each of the plurality of microelectronic devices attached to the substrate;
   after attaching the first surface of each of the plurality of microelectronic devices to the substrate, closing the substrate in a transfer molding cavity of a transfer molding apparatus such that a release layer coating an internal surface of the transfer molding cavity physically contacts the plurality of contact pads exposed at the second surface of each of the plurality of microelectronic devices;
   injecting a molding compound into the transfer molding cavity around each of the plurality of microelectronic devices, wherein the release layer, in physical contact with the plurality of contact pads exposed at the second surface of each of the plurality of microelectronic devices while injecting the molding compound, prevents the molding compound from physically contacting the plurality of contact pads;
   removing the substrate from the transfer molding apparatus by removing the release layer from the second surface of each of the plurality of microelectronic devices; and
   forming at least one redistribution layer over ones of the plurality of microelectronic devices, the at least one redistribution layer physically contacts the second surface of each of the plurality of microelectronic devices, wherein the at least one redistribution layer electrically interconnects at least two of the plurality of microelectronic devices.

2. The method of claim 1, wherein attaching the plurality of microelectronic devices to the substrate defines a plurality of spaces between the substrate and at least one of the plurality of microelectronic devices, and wherein injecting the molding compound fills the plurality of spaces between the substrate and the at least one of the plurality of microelectronic devices with the molding compound.

3. The method of claim 1 further comprising at least one of:
   heating the molding compound before injecting the molding compound into the transfer molding cavity; and
   heating the injected molding compound within the transfer molding cavity.

4. The method of claim 1, injecting the molding compound utilizes a pump, a plunger, a valve, or a combination thereof to inject the molding compound into the transfer molding cavity.

5. The method of claim 4, wherein injecting the molding compound utilizes a vacuum pump to inject the molding compound into the transfer molding cavity at an injection pressure, and wherein the vacuum pump reduces a pressure level within the transfer molding cavity to a cavity pressure less than the injection pressure.

6. The method of claim 5, wherein the cavity pressure is a vacuum.

7. The method of claim 1, wherein no planarization process is applied to the molding compound between injecting the molding compound into the transfer molding apparatus and forming the at least one redistribution layer.

8. The method of claim 1, wherein the release layer comprises one or more layers of polytetrafluoroethylene (PTFE), ethylene tetrafluoroethylene (ETFE), or a combination thereof.

9. The method of claim 1 further comprising:
depositing a ball-grid array on a topmost one of the at least one redistribution layer, wherein the ball-grid array comprises a plurality of discrete conductive elements; and
forming a second molding compound between each of the plurality of discrete conductive elements of the ball-grid array.

10. The method of claim 1, wherein the molding compound comprises a plurality of micro-filler elements, and wherein no boundary of any of the plurality of micro-filler elements is substantially parallel to a substantially planar surface of the molding compound after forming the at least one redistribution layer.

11. A method comprising:
attaching an innermost surface of each of a plurality of microelectronic devices to a surface of a planar substrate using an adhesive layer, the innermost surface of each of the plurality of microelectronic devices is proximate the surface of the planar substrate, and an outermost surface of each of the plurality of microelectronic devices is distal the surface of the planar substrate, the outermost surface of each of the plurality of microelectronic devices including contact pads of respective ones of the plurality of microelectronic device;
after attaching the innermost surface of each of the plurality of microelectronic devices to the surface of the planar substrate, positioning the plurality of microelectronic devices in a transfer molding cavity of a transfer molding apparatus, wherein at least the contact pads of each of the plurality of microelectronic devices are physically contacted by an insulating release layer of the transfer molding apparatus within the transfer molding cavity;
injecting a molding compound into the transfer molding cavity, the molding compound flowing on the surface of the planar substrate and around the plurality of microelectronic devices while the insulating release layer physically contacts the contact pads of each of the plurality of microelectronic devices, wherein after injecting the molding compound, the contact pads are exposed through the molding compound without any subsequent processing on the molding compound; and
after injecting the molding compound, separating the insulating release layer from the contact pads.

12. The method of claim 11, wherein the insulating release layer is a continuous layer contacting an entirety of the outermost surface of each of the plurality of microelectronic devices.

13. The method of claim 11, wherein the insulating release layer is a patterned layer and does not contact at least a portion of the outermost surface of each of the plurality of microelectronic devices.

14. The method of claim 11 further comprising forming at least one redistribution layer electrically connecting each of the plurality of microelectronic devices.

15. The method of claim 14, wherein no planarization process is applied to the molding compound between injecting the molding compound into the transfer molding cavity and forming the at least one redistribution layer.

16. The method of claim 14, wherein the surface of the planar substrate is a surface of a coating layer, and wherein the coating layer comprises one or more layers of glass, adhesive, or a combination thereof.

17. A method comprising:
attaching a first surface of a first semiconductor die to a substrate, a second surface of the first semiconductor die being disposed farther from the substrate than the first surface, the first semiconductor die comprising a first plurality of contact pads exposed at the second surface and opposite the first surface;
attaching a second semiconductor die to the substrate, the second semiconductor die comprising a second plurality of contact pads;
enclosing the first semiconductor die and the second semiconductor die in an internal molding cavity of a molding apparatus while the first semiconductor die and the second semiconductor die are attached to the substrate, enclosing the first semiconductor die and the second semiconductor die comprising physically contacting the first plurality of contact pads to an insulating release layer coating a surface of the internal molding cavity;
dispensing a molding compound between the first semiconductor die and the second semiconductor die while the insulating release layer is in direct contact with the first plurality of contact pads, thereby preventing the molding compound from contacting the first plurality of contact pads during dispensing the molding compound; and
removing the first semiconductor die and the second semiconductor die from the molding apparatus by heating the insulating release layer.

18. The method of claim 17, wherein enclosing the first semiconductor die and the second semiconductor die further comprises physically contacting the second plurality of contact pads to the insulating release layer, and wherein the insulating release layer prevents the molding compound from contacting the second plurality of contact pads during dispensing the molding compound.

19. The method of claim 17 further comprising after removing the first semiconductor die and the second semiconductor die from the molding apparatus, forming a redistribution layer over and electrically connecting the first semiconductor die to the second semiconductor die, wherein no planarization process is applied to the molding compound between dispensing the molding compound and forming the redistribution layer.

20. The method of claim 17, wherein a surface of the molding compound, as dispensed, is substantially coplanar with a surface of the first plurality of contact pads.

* * * * *